(12) United States Patent
Tuominen et al.

(10) Patent No.: US 9,622,354 B2
(45) Date of Patent: Apr. 11, 2017

(54) METHOD FOR MANUFACTURING A CIRCUIT BOARD STRUCTURE

(71) Applicant: GE Embedded Electronics Oy, Helsinki (FI)

(72) Inventors: Risto Tuominen, Espoo (FI); Antti Iihola, Helsinki (FI); Petteri Palm, Helsinki (FI)

(73) Assignee: GE Embedded Electronics Oy, Helsinki (FI)

( * ) Notice: Subject to any disclaimer, the term of this patent is extended or adjusted under 35 U.S.C. 154(b) by 361 days.

(21) Appl. No.: 14/076,292

(22) Filed: Nov. 11, 2013

(65) Prior Publication Data

US 2014/0059851 A1 Mar. 6, 2014

Related U.S. Application Data

(63) Continuation of application No. 11/917,737, filed as application No. PCT/FI2006/000207 on Jun. 15, 2006, now Pat. No. 8,581,109.

(30) Foreign Application Priority Data

Jun. 16, 2005 (FI) ..................................... 20050646

(51) Int. Cl.
*H05K 3/30* (2006.01)
*H05K 3/06* (2006.01)
(Continued)

(52) U.S. Cl.
CPC ......... *H05K 3/064* (2013.01); *H01L 21/4846* (2013.01); *H01L 23/13* (2013.01);
(Continued)

(58) Field of Classification Search
CPC .. H05K 3/0002; H05K 3/0047; H05K 3/0067; H05K 3/0094; H05K 3/0097; H05K 3/4061; H05K 3/4611; H05K 3/4617; H05K 3/4679; H05K 1/0306; H05K 1/112
USPC ......... 29/831, 832, 840, 841, 844, 846, 851, 29/854; 156/64, 356, 357, 358; 174/259, 174/260
See application file for complete search history.

(56) References Cited

U.S. PATENT DOCUMENTS 4,246,595 A   1/1981   Noyori et al.
4,541,893 A *  9/1985   Knight .............. H01L 21/76885
                                                         204/192.35

(Continued)

FOREIGN PATENT DOCUMENTS

EP    0774888    10/1998
EP    1111662    6/2001
(Continued)

*Primary Examiner* — Paul D Kim
(74) *Attorney, Agent, or Firm* — Seppo Laine Oy

(57) ABSTRACT

A method for manufacturing a circuit-board structure wherein a conductor foil is provided on an insulating material layer, a resist layer is spread on the conductor foil and a recess formed in the conductor foil and insulating material layer. The resist layer is patterned to form a conductor-pattern having openings wherein conductor patterns may be grown. A component is attached to the conductor foil and conductor pattern and conductor material is removed which does not form part of a conductor pattern.

14 Claims, 7 Drawing Sheets

(51) Int. Cl.
*H01L 21/48* (2006.01)
*H01L 23/13* (2006.01)
*H05K 1/18* (2006.01)
*H01L 23/538* (2006.01)
*H01L 23/544* (2006.01)
*H01L 23/00* (2006.01)
*H05K 3/20* (2006.01)
*H05K 3/28* (2006.01)
*H05K 3/32* (2006.01)
*H05K 3/40* (2006.01)

(52) U.S. Cl.
CPC .............. *H01L 24/24* (2013.01); *H01L 24/82* (2013.01); *H05K 1/183* (2013.01); *H05K 1/187* (2013.01); *H05K 1/188* (2013.01); *H05K 3/303* (2013.01); *H01L 23/5389* (2013.01); *H01L 23/544* (2013.01); *H01L 24/81* (2013.01); *H01L 24/83* (2013.01); *H01L 24/90* (2013.01); *H01L 2223/54473* (2013.01); *H01L 2224/16* (2013.01); *H01L 2224/18* (2013.01); *H01L 2224/24227* (2013.01); *H01L 2224/293* (2013.01); *H01L 2224/2929* (2013.01); *H01L 2224/81121* (2013.01); *H01L 2224/81192* (2013.01); *H01L 2224/81203* (2013.01); *H01L 2224/81205* (2013.01); *H01L 2224/81801* (2013.01); *H01L 2224/82039* (2013.01); *H01L 2224/83132* (2013.01); *H01L 2224/83192* (2013.01); *H01L 2224/83851* (2013.01); *H01L 2224/92144* (2013.01); *H01L 2924/00011* (2013.01); *H01L 2924/00014* (2013.01); *H01L 2924/014* (2013.01); *H01L 2924/01005* (2013.01); *H01L 2924/01006* (2013.01); *H01L 2924/01018* (2013.01); *H01L 2924/01027* (2013.01); *H01L 2924/01029* (2013.01); *H01L 2924/01033* (2013.01); *H01L 2924/01047* (2013.01); *H01L 2924/01078* (2013.01); *H01L 2924/07802* (2013.01); *H01L 2924/07811* (2013.01); *H01L 2924/12042* (2013.01); *H01L 2924/14* (2013.01); *H01L 2924/1433* (2013.01); *H01L 2924/1461* (2013.01); *H01L 2924/1517* (2013.01); *H01L 2924/15153* (2013.01); *H05K 3/205* (2013.01); *H05K 3/284* (2013.01); *H05K 3/305* (2013.01); *H05K 3/32* (2013.01); *H05K 3/321* (2013.01); *H05K 3/4069* (2013.01); *H05K 2201/0355* (2013.01); *H05K 2201/0969* (2013.01); *H05K 2201/09563* (2013.01); *H05K 2201/10674* (2013.01); *H05K 2201/10977* (2013.01); *H05K 2203/0353* (2013.01); *H05K 2203/063* (2013.01); *H05K 2203/0723* (2013.01); *Y10T 29/4913* (2015.01)

(56) References Cited

U.S. PATENT DOCUMENTS

| | | |
|---|---|---|
| 4,731,645 A | 3/1988 | Parmentier et al. |
| 4,993,148 A | 2/1991 | Adachi et al. |
| 5,042,145 A | 8/1991 | Boucquet |
| 5,048,179 A | 9/1991 | Shindo et al. |
| 5,081,562 A | 1/1992 | Adachi et al. |
| 5,216,806 A | 6/1993 | Lam |
| 5,227,338 A | 7/1993 | Kryzaniwsky |
| 5,248,852 A | 9/1993 | Kumagai |
| 5,306,670 A | 4/1994 | Mowatt et al. |
| 5,353,195 A | 10/1994 | Fillion et al. |
| 5,355,102 A | 10/1994 | Kornrumpf et al. |
| 5,407,864 A | 4/1995 | Kim |
| 5,497,033 A | 3/1996 | Fillion et al. |
| 5,510,580 A | 4/1996 | Shirai et al. |
| 5,552,633 A | 9/1996 | Sharma |
| 5,633,204 A | 5/1997 | Tago et al. |
| 5,637,919 A | 6/1997 | Grabbe |
| 5,654,220 A | 8/1997 | Leedy |
| 5,838,545 A | 11/1998 | Clocher et al. |
| 5,840,593 A | 11/1998 | Leedy |
| 5,870,289 A | 2/1999 | Tokuda et al. |
| 5,882,957 A | 3/1999 | Lin |
| 5,936,847 A | 8/1999 | Kazle |
| 5,985,693 A | 11/1999 | Leedy |
| 6,037,665 A | 3/2000 | Miyazaki |
| 6,038,133 A | 3/2000 | Nakatani et al. |
| 6,084,781 A | 7/2000 | Klein |
| 6,154,366 A | 11/2000 | Ma et al. |
| 6,232,666 B1 | 5/2001 | Corisis et al. |
| 6,242,282 B1 | 6/2001 | Fillion et al. |
| 6,271,469 B1 | 8/2001 | Ma et al. |
| 6,284,564 B1 | 9/2001 | Balch et al. |
| 6,292,366 B1 | 9/2001 | Platt |
| 6,396,148 B1 | 5/2002 | Eichelberger et al. |
| 6,402,970 B1 | 6/2002 | Lin |
| 6,475,877 B1 | 11/2002 | Saia et al. |
| 6,489,685 B2 | 12/2002 | Asahi et al. |
| 6,495,406 B1 * | 12/2002 | Honeycutt ........ H01L 21/28044 257/E21.198 |
| 6,537,848 B2 | 3/2003 | Camenforte et al. |
| 6,538,210 B2 | 3/2003 | Sugaya et al. |
| 6,551,861 B1 | 4/2003 | Lin |
| 6,562,660 B1 | 5/2003 | Sakamoto et al. |
| 6,576,493 B1 | 6/2003 | Lin |
| 6,607,943 B1 | 8/2003 | Kinsman |
| 6,701,614 B2 | 3/2004 | Ding et al. |
| 6,710,458 B2 | 3/2004 | Seko |
| 6,713,859 B1 | 3/2004 | Ma |
| 6,783,077 B1 | 8/2004 | Fannasch |
| 6,790,712 B2 | 9/2004 | Bai |
| 6,803,304 B2 * | 10/2004 | Asami ............... H01L 21/76807 257/E21.508 |
| 6,806,428 B1 | 10/2004 | Kimura et al. |
| 6,876,072 B1 | 4/2005 | Wang et al. |
| 6,979,596 B2 | 12/2005 | Corisis et al. |
| 6,991,966 B2 | 1/2006 | Tuominen |
| 7,183,658 B2 | 2/2007 | Towle et al. |
| 7,294,529 B2 | 11/2007 | Tuominen |
| 7,663,215 B2 | 2/2010 | Tuominen et al. |
| 7,673,387 B2 | 3/2010 | Tuominen et al. |
| 7,696,005 B2 | 4/2010 | Iihola et al. |
| 8,581,109 B2 * | 11/2013 | Tuominen ........... H01L 21/4846 174/260 |
| 2002/0017711 A1 | 2/2002 | Kwon et al. |
| 2002/0053465 A1 | 5/2002 | Kawakita et al. |
| 2002/0117743 A1 | 8/2002 | Nakatani et al. |
| 2002/0133943 A1 | 9/2002 | Sakamoto et al. |
| 2002/0185303 A1 | 12/2002 | Takeuchi et al. |
| 2003/0067074 A1 | 4/2003 | Kinsman |
| 2003/0068852 A1 | 4/2003 | Towle et al. |
| 2003/0068877 A1 | 4/2003 | Kinsman |
| 2003/0100142 A1 | 5/2003 | Shin et al. |
| 2003/0137045 A1 | 7/2003 | Sugaya et al. |
| 2003/0159852 A1 | 8/2003 | Nakamura |
| 2003/0209796 A1 | 11/2003 | Kindo et al. |
| 2004/0000710 A1 | 1/2004 | Oya |
| 2004/0097086 A1 | 5/2004 | Igarashi et al. |
| 2004/0266067 A1 | 12/2004 | Bai |
| 2005/0000729 A1 | 1/2005 | Iljima et al. |
| 2005/0001331 A1 | 1/2005 | Kojima et al. |
| 2005/0285244 A1 | 12/2005 | Chen |
| 2006/0105500 A1 | 5/2006 | Chang |
| 2006/0163740 A1 | 7/2006 | Ohno et al. |
| 2006/0278967 A1 | 12/2006 | Tuominen et al. |
| 2007/0166886 A1 | 7/2007 | Iihola et al. |
| 2007/0267136 A1 | 11/2007 | Tuominen et al. |
| 2008/0202801 A1 | 8/2008 | Tuominen et al. |

(56) References Cited

U.S. PATENT DOCUMENTS

2008/0295326 A1  12/2008  Tuominen et al.
2010/0202115 A1  8/2010  Tuominen et al.

FOREIGN PATENT DOCUMENTS

| | | |
|---|---|---|
| EP | 1156525 | 11/2001 |
| EP | 1542519 | 6/2005 |
| GB | 2342995 | 5/2000 |
| JP | 4283987 | 10/1992 |
| JP | 9139567 | 5/1997 |
| JP | 2757748 | 5/1998 |
| JP | 7045938 | 5/1998 |
| JP | 11103165 | 4/1999 |
| JP | 2000311229 | 11/2000 |
| JP | 2000349437 | 12/2000 |
| JP | 200153447 | 2/2001 |
| JP | 2001274034 | 10/2001 |
| JP | 2001345560 | 12/2001 |
| JP | 200216327 | 1/2002 |
| JP | 2002158307 | 5/2002 |
| JP | 2002271033 | 9/2002 |
| JP | 200337205 | 2/2003 |
| JP | 2003188314 | 7/2003 |
| JP | 2004146634 | 5/2004 |
| JP | 2004327612 A * | 11/2004 |
| WO | WO 03/065778 | 8/2003 |
| WO | WO 03/065779 | 8/2003 |
| WO | WO 2004/077902 | 9/2004 |
| WO | WO 2004/077903 | 9/2004 |
| WO | WO 2004/089048 | 10/2004 |
| WO | WO 2005/020651 | 3/2005 |
| WO | WO 2005027602 | 3/2005 |

* cited by examiner

METHOD FOR MANUFACTURING A CIRCUIT BOARD STRUCTURE

This application is a continuation of U.S. patent application Ser. No. 11/917,737, filed on Apr. 28, 2008, which is a National Stage of PCT/FI2006/000207 filed Jun. 15, 2006, and which claims priority to Finland Application No. 20050646 filed on Jun. 16, 2005.

The present invention relates to a method for manufacturing a circuit-board structure and a circuit-board structure.

The circuit-board structure manufactured can form, for example, part of a circuit board, a multilayer circuit board, a component packet, or an electronic module.

The circuit-board structure comprises at least one layer of conductor patterns and at least one component, which is connected electrically to the conductor patterns.

The invention also relates to methods, in which at least one component connected to a conductor pattern is surrounded by an insulation-material layer. Such solutions can be alternatively also referred to as circuit-board or module structures, which contain buried, embedded, or built-in components. The insulation-material layer surrounding the component is typically part of the basic structure of a circuit-board or module structure, which forms a support for the innermost conductor layers of the circuit board or module.

Application publication US 2005/0001331 discloses a circuit-board structure manufacturing method, in which first of all a circuit board is manufactured, which comprises an insulator layer and a conductor pattern on top of it. After this, a semiconductor component is connected to the conductor patterns by means of a suitable flip-chip method. The connection takes place through contact bumps on the surface of the semiconductor component. In the method of the US publication, after the connection of the component a patterned and unpatterned insulation-material layer is laminated on top of the circuit board and a conductor-pattern layer is further laminated on their surface.

Patent publications U.S. Pat. Nos. 6,038,133 and 6,489,685 as well as application publication US 2002/0117743 disclose a method, in which a conductor pattern is manufactured on the surface of a detachable membrane, and a semiconductor component is connected to the conductor pattern by means of a flip-chip attachment method. After this, the component is surrounded with a layer of insulation material and the detachable membrane is removed.

The aforementioned publication U.S. Pat. No. 6,038,133 and US 2002//0117743 also disclose methods, in which a component is connected by a flip-chip method not to conductor patterns but to a unified conductor foil, from which conductors patterns are formed in a later stage of the process. Corresponding method are also disclosed, for example, in the publications U.S. Pat. No. 5,042,145; WO 2004/077902; WO 2004/077903; and WO 2005/020651.

In addition to the aforementioned types of method, many other methods are known, which can be used to manufacture circuit-board structures containing components. The components can, for example, first of all be placed inside an insulating-material layer and connected electrically to the conductor layer only after this, as is disclosed in application publication WO 2004/089048. In the method of application publication WO 2004/089048, the component is glued to the surface of a conductor layer and, after the gluing of the component, an insulating-material layer, which surrounds the component attached to the conductor layer, is formed of attached to the conductor layer. After the gluing of the component, vias are also made, through which electrical contacts are formed between the conductor layer and the contact areas of the component. After this, conductor patterns are formed from the conductor layer, to the surface of which the component is glued.

The invention is intended to develop a new method for manufacturing a circuit-board structure.

According to the invention, a method is implemented, in which a conductor layer is made, which comprises both a conductor pattern and a conductor foil. The component is attached to the conductor layer comprising the conductor pattern and conductor foil and, after the attaching of the component, the conductor layer is thinned, in such a way that the conductor material of the conductor layer is removed from outside the conductor pattern.

In this way, a new method for manufacturing a circuit-board structure is created.

The invention has several embodiments, a few of which are presented briefly in the following.

The manufacture of the conductor layer can be performed in several different ways:

According to one embodiment, the conductor layer is manufactured by growing a conductor pattern on top of a conductor foil, using a growing method. Thus the conductor foil is grown directly into its correct shape.

According to a second embodiment, the conductor layer is manufactured by thinning areas of a thicker conductor foil, in such a way that a thinner conductor foil and a conductor pattern on top of this remain. The thinning of the areas can be implemented, for example, using a photo-lithographic method, or a laser-ablation method.

The attachment of the component can also be performed using several techniques and in one or more stages. The attachment of the component is concerned with achieving a mechanical attachment between the component and the conductor pattern, in such a way that the component and the conductor pattern will remain in place in the circuit-board structure. The attachment of the component is also concerned with making an electrical contact between the component and the conductor pattern, in such a way that, through the conductor pattern, the desired voltages and currents can be led to the component and away from the component. The mechanical attachment and the electrical contact can be made simultaneously using a single connection method, or proceed in such a way that the mechanical attachment is made first and the electrical contact in some suitable later process stage. It is also possible to proceed in such a way that the electrical contact is made first along with a preliminary mechanical attachment, in which case the final mechanical attachment is made in some suitable later process stage.

The electrical contact of the component can be made using several techniques:

In one embodiment, the component is connected to the conductor layer using an ultrasonic bonding method.

In a second embodiment, the component is connected to the conductor layer by soldering.

In a third embodiment, the component is connected to the conductor layer by a conductive adhesive.

In a fourth embodiment, the component is connected to the conductor layer using a via method.

In the first, second, and third connection techniques for the component, contact openings need not necessarily be made in the conductor layer at the locations of the contact areas of the component. If, on the other hand, a via method is used, contact openings, the position of which corresponds to the locations of the contact areas of the component, are made in the conductor layer, or at least in the conductor-pattern part of it. The making of the contact openings too can also be performed according to several different embodiments:

In a first embodiment, the contact openings are made before the attachment of the component and through the entire conductor layer, i.e. the openings extend through both the conductor layer and the conductor pattern. The component can then be aligned with the contact openings.

In a second embodiment, the contact openings are made partly before the attachment of the component, in such a way that the partly made contact openings extend into the conductor layer, without extending through it. In such an embodiment, the contact openings are opened later to extend through the conductor pattern, or they are opened in connection with the thinning of the conductor layer.

In a third embodiment, the contact openings are made after the attachment of the component, but before the thinning of the conductor pattern. In such an embodiment, the contact openings are made in such a way that they extend through the entire conductor layer, or so that they partly penetrate it, in such a way that they open at the latest in connection with the thinning of the conductor layer.

In a fourth embodiment, the contact openings are made after the attachment of the component and the thinning of the conductor pattern. In such an embodiment, the contact openings extend through the conductor layer.

In a fifth embodiment, the contact openings are made in the conductor pattern in connection with the making of the conductor pattern.

When using a via method, the contact openings are filled, in a suitable stage of the method, with a conductor material, for example, a metal, metal alloy, a conductive paste or conductive polymer, for example, a conductive adhesive. Alternatively, the edges of the contact openings are surfaced with a conductor material. The best electrical contact is achieved using an embodiment, in which the contact openings are filled by growing metal into the openings and on top of the contact areas of the component, for example, using a chemical and/or electrochemical surfacing method. It will then be possible to create in the contact openings a via structure that is of essentially pure metal. It will then also be possible to create in the contact openings a via structure, which is in metallurgical contact with the conductor material of the contact areas.

The mechanical attachment of the component can be made using several techniques:

In one embodiment, the component is attached to the conductor layer by soldering or using an ultrasonic bonding method. The mechanical attachment created is later reinforced with the aid of an insulating material, for example, by filling the gap between the component and the conductor layer with a hardening polymer, or by surrounding the component tightly with an insulating material that adheres to the surface of both the component and the conductor pattern.

In a second embodiment, the component is attached to the conductor layer using a conductive adhesive. The adhesive can already at the same time form itself a sufficient mechanical attachment. The mechanical attachment can also be reinforced in the manner described in connection with the previous embodiment. The adhesive can be an isotropically conductive adhesive, or an anisotropically conductive adhesive.

In a third embodiment, the component is attached to the conductor layer by an insulating adhesive. An electrical contact can be made later through the insulating adhesive.

The thinning of the conductor layer can also be performed in several different ways. The thinning of the conductor layer is intended to removed conductor material from between the conductor patterns.

According to one embodiment, the conductor layer is thinned throughout, in such a way that the thickness of the conductor layer diminishes both at the locations of the conductor patterns and in the areas remaining between the conductor patterns. The thinning can be performed, for example, by wet-etching.

According to a second embodiment, the conductor layer is thinned in areas, in such a way that the thickness of the conductor layer diminishes in the areas remaining between the conductor patterns, but remains essentially unchanged at the locations of the conductor patterns. This can be achieved, for example, by wet-etching, in which a suitable etching mask is used on the surface of the conductor patterns.

In several embodiments, an insulating-material layer is made around the component and on the surface of the conductor pattern. The insulating-material layer can be made from one or more insulating-material sheets, or from an insulating material spread in a fluid form. The insulating-material layer can be made, for example, according to the following embodiments:

In one embodiment, the insulating-material layer is taken and a conductor layer is made on its surface. Before this or after this a suitable opening for the component is made in the insulating-material layer.

In a second embodiment, an insulating-material layer is made on the surface of the conductor layer. After this, an opening for the component is opened in the insulating-material layer.

In a third embodiment, the component is first attached to the conductor layer (mechanical attachment or electrical contact and at least a preliminary mechanical attachment), and after this an insulating-material layer is made on the surface of the conductor layer and around the component.

In the embodiments, the conductor foil of the conductor layer is typically a unified, or at least a substantially unified conductor foil. Thus, there can be, for example, small holes in the conductor layer, for example, for alignment purposes. The conductor layer can, however, be handled as a single piece. The thickness of the conductor foil is typically such that it will withstand the treatment required by the process without breaking or being damaged, also without support. In the embodiments, it is of course possible to use a thinner conductor foil, in which case the conductor foil will be supported with the aid of a support layer.

In the embodiments, the conductor pattern of the conductor layer includes conductors of the conductor-pattern layer being made in the circuit-board structure, or patterns corresponding to these conductors. The conductors can thus be connected to each other, or separate, according to the desired circuit-board design.

References to the contact areas of the component mean conductor areas on the surface of the component, through which an electrical contact can be formed to the component. In this meaning, the contact area can be formed by, for example, a contact bump or a conductor area on the surface of the component.

In the following, the invention is examined with the aid of examples and with reference to the accompanying drawings.

Figure 1:
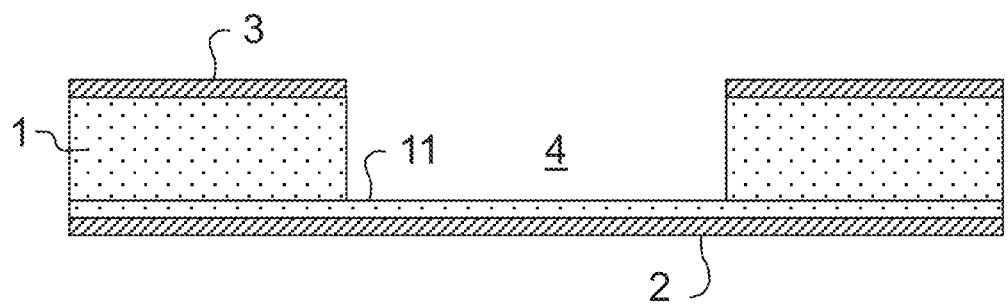
FIGS. 1-8 show a series of cross-sections of the intermediate stages of the circuit-board structures, in a manufacturing process according to a first embodiment.

In the first example, the circuit-board blank shown in FIG. 1 is manufactured first of all. The circuit-board blank of FIG. 1 comprises an insulating-material layer 1, a conductor foil 3 on the first surface of this, and a conductor foil 2 on the second surface.

The circuit-board blank also comprises a recess 4. In addition, the circuit-board blank comprises a thinner insulating-material layer 11 between the insulating-material layer 1 and the conductor foil 2. The insulating-material layer 11 can be of material differing from that of the insulating-material layer 1, or it can be part of the insulating-material layer 1. In the former case, the circuit-board blank of FIG. 1 may have been formed, for example, by laminating together or otherwise combining with each other the insulating-material layer 1, the conductor foil 2, the conductor foil 3, and the insulating-material layer 11. In the latter case, the circuit-board blank of FIG. 1 may have been formed, for example, in such a way that a recess 4 has been made in the blank formed by the insulating-material 1, the conductor foil 2, and the conductor foil 3. In that case, the recess 4 will not extent completely through the insulating-material layer 1, but instead a corresponding part of the insulating-material layer 11 has been left on the 'bottom' of the recess.

The method of the example can, of course, be modified in such a way that the recess 4 extends to the conductor foil 2, in which case there will not be an insulating-material layer 11 in the circuit-board blank, at least at the location of the recess. However, at least in some embodiments the reliability of the circuit-board structure can be improved by using an insulating-material layer 11. This is due to the fact that the use of an insulating-material layer 11 for its part ensures that unnecessary openings will not remain in the insulating material between the component and the conductor foil 2.

Figure 2:
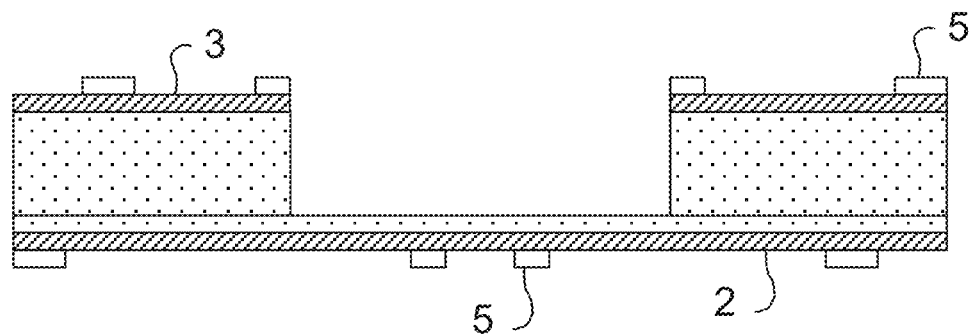
Figure 3:
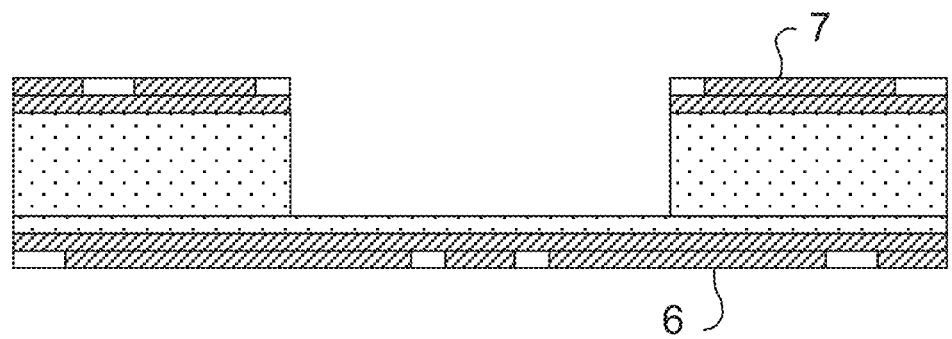

Manufacture continues from the situation shown in FIG. 1, by spreading resist layers 5, typically photoresist layers, on the surfaces of the conductor foils 2 and 3. This stage is shown in FIG. 2. The photoresist layers 5 are exposed through a patterned mask and after this the blank is developed. After developing, the exposed photoresist layers 5 are patterned in the desired manner to form conductor-pattern masks, which is shown in FIG. 3.

Figure 4:
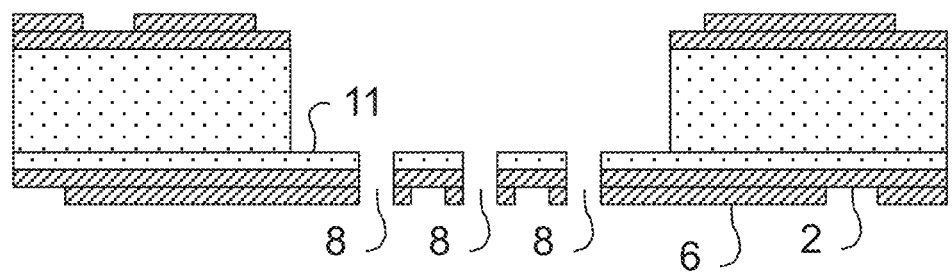

Manufacture is continued by electrolytically growing a conductor material, typically copper, in the areas from which the photoresist was removed. The desired conductor patterns 6 and 7 are then formed on the surfaces of the conductor foils 2 and 3, which is shown in FIG. 4. The thickness of the conductor pattern can be, for example, 20 micrometres while the width of the line of the conductor patterns being made can be less than 20 micrometres. The method can thus also be used to manufacture small and precise conductor patterns.

The method can be modified in such a way that a layer of some other metal or metal alloy, for example tin, can be made on the surface of the conductor patterns 6 and 7, or on the interface between the conductor foils 2 and 3 and the conductor patterns 6 and 7. This layer can be used as an etching stop.

The method can also be modified in such a way that the recess 4 is made only after the spreading of the photoresist layer 5, or at an even later process stage.

After the manufacture of the conductor patterns 6 and 7, the resist layers 5 can be removed. In addition, contact openings 8 are made in the conductor pattern 6 of the circuit-board blank, at the locations of the contact areas of the component. The contact openings 8 can be made in such a way that they essentially extend through the conductor pattern 8, or in such a way that they essentially extend through both the conductor pattern 8 and the conductor foil 2, (i.e. through the entire conductor layer). It is also possible to make the contact openings from the other direction, in such a way that they extend through only the insulating-material layer 11 and the conductor foil 2. In the example, the contact openings 8 are made in such a way that they extend through the conductor pattern 6, the conductor foil 2, and the insulating-material layer 11. FIG. 4 shows the circuit-board blank after this intermediate stage.

The contact openings 8 can be made, for example, by drilling with a laser. The contact openings 8 are aligned correctly in position relative to the conductor pattern 6. The mutual position of the contact openings 8 corresponds to the mutual position of the contact areas of the component. Thus, at least one contact opening 8 is made for each contact area participating in the creation of an electrical contact. The surface area of the contact openings 8 being made can be more or less as large as the surface area of the corresponding contact areas. The surface area of a contact opening 8 can, of course, also be selected to be smaller, or in some embodiments slightly larger, than the surface area of the corresponding contact area.

Figure 5:
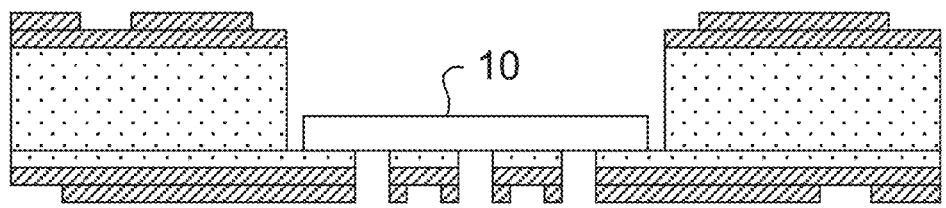
Figure 6:
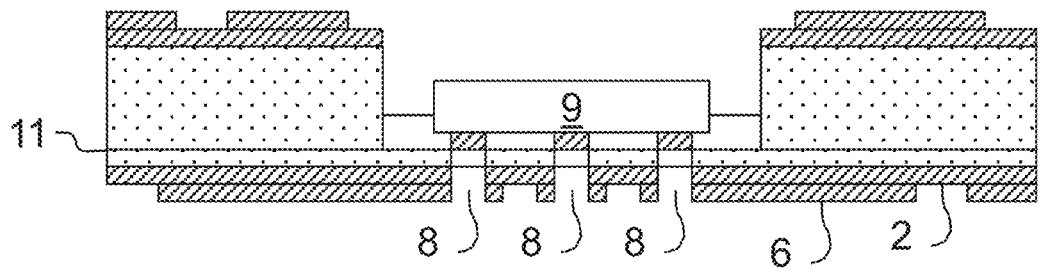

In the example, the component 9 is attached to the circuit-board blank with the aid of an adhesive 10. For the gluing, an adhesive layer 10 is spread on the surface of the insulating-material layer 11, on the 'bottom' of the recess 4. FIG. 5 shows this intermediate stage. Alternatively, the adhesive layer can be spread on the attachment surface of the component 9, or on both the attachment surface of the component 9 and on the surface of the insulating-material layer 11. The adhesive 10 can also be spread in stages and in layers. After this, the components 9 can be aligned in the positions designed for the components 9, with the aid of alignment marks. For example, the contact openings 8, or the conductor patterns 6 or 7, or separate alignment marks (not shown in the figures) can act as alignment marks. FIG. 6 shows the circuit-board blank after the gluing of the component 9.

The term attachment surface of the component 9 refers to that surface of the component 9 that will face the conductor pattern 6. The attachment surface of the component 9 comprises contact areas, by means of which an electrical contact can be made to the component. The contact areas can be, for example, flat areas on the surface of the component 9, or more usually contact protrusions, such as contact bumps, on the surface of the component 9. There are usually at least two contact areas or contact protrusions in the component 9. In complex microcircuits there can well be many contact areas.

In many embodiments, it is advantageous to spread so much adhesive on the attachment surface or attachment surfaces that the adhesive completely fills the space between the component 9 and the structure coming against the component. A separate filler agent will then not be required. Good filling will reinforce the mechanical connection between the component 9 and the circuit-board blank, so that a mechanically more durable construction will be achieved. A comprehensive adhesive layer 10 without gaps will also support the conductor pattern and protect the structure in later process stages. During gluing, adhesive also usually gets into the contact openings 8, if these open towards the attachment surface.

The term adhesive refers to a material, by means of which a component can be attached to the circuit-board blank. One property of an adhesive is that the adhesive can be spread on the surface of the circuit-board blank and/or of the component in a relatively fluid form, or otherwise in a form that conforms to surface shapes, for example, in the form of a film. Another property of an adhesive is that after spreading the adhesive hardens or can be hardened, at least partly, so that the adhesive will be able to hold the component in place at least until the component is attached to the structure in some other way. The third property of the adhesive is its adhesive ability, i.e. its ability to bond to the surface being glued.

The term gluing refers to attaching the component and the circuit-board to each other with the aid of an adhesive. In gluing, adhesive is thus brought between the component and the circuit-board blank and the component is set in a suitable position relative to the circuit-board blank, in which the adhesive is in contact with the component and the circuit-board blank and at least partly fills the space between the component and the circuit-board blank. After this, the adhesive is allowed to (at least partly) harden or the adhesive is (at least partly) actively hardened, so that the component attaches to the circuit-board blank with the aid of the adhesive. In some embodiments, the contact protrusions of the component may, during gluing, extend through the adhesive layer to come in contact with the rest of the structure of the circuit-board blank.

The adhesive used in the embodiments is, for example, a thermally cured epoxy. The adhesive is selected in such a way that the adhesive used has sufficient adhesion with the circuit-board blank and the component. One advantageous property of the adhesive is a suitable coefficient of thermal expansion, so that the thermal expansion of the adhesive will not differ too much from the thermal expansion of the surrounding material during the process. The adhesive selected should also preferably have a short hardening time, preferably of a few seconds at most. In this time the adhesive should harden at least partly in such a way that it is able to hold the component in place. The final hardening can take clearly more time and the final hardening can indeed be designed to take place in connection with later process stages. The electrical conductivity of the adhesive is preferably in the order of the electrical conductivity of insulating materials.

The component 9 to be attached can be, for example, an integrated circuit, such as a memory chip, a processor, or an ASIC. The component to be attached can also be, for example, a MEMS, LED, or a passive component. The component to be attached can be cased or uncased, and it can comprise contact bumps in the contact areas or be without bumps. There can also be a conductor surfacing thinner than a contact bump on the surface of the contact areas of the component. The outer surface of the contact areas of the component can thus be on the level of the outer surface of the component, on the bottom of recesses on the surface of the component, or on the surface of protrusions extending from the surface of the component.

After the gluing of the component 9, the recess is filled with a filler material 12. The example can also be modified in such a way that manufacture is started from a circuit-board blank (the situation in FIG. 1), which comprises only a conductor foil 2 and possibly an insulating-material layer 11. After this, process stages that are otherwise the same as those described above, except that naturally the method stages relating to the conductor foil 3, the conductor pattern 7, and the resist layer 5 relating to them are omitted. In this embodiment, the circuit-board blank comprises, after the gluing of the component (refer to FIG. 6):

a conductor layer formed by a conductor foil 2 and a conductor pattern 6,
an adhesive layer 10,
optionally an insulating-material layer 11 between the conductor layer and the adhesive layer 10,
contact openings 8, and
at least one component 9.

In this modified embodiment, there is not recess 4 to be filled, instead in this stage an insulator layer 1, which surrounds the component 9 and supports the conductor layers 2 and 6, is made on the surface with the component 9 of the circuit-board blank. The insulator layer 1 can be formed, for example, by putting an insulating-material sheet, in which openings have been made at the location of the components 9, on top on the circuit-board blank. In addition, a unified insulating-material sheet can be put on top of the insulating-material sheet 9. Both sheets can be similar, or sheets than differ from each other can also be used, at least one of which is prehardened or unhardened. Examples of materials suitable for the insulator layer 1 are PI (polyimide), FR4, FR5, aramid, polytetrafluoroethylene, Teflon®, LCP (liquid crystal polymer), and a prehardened binder layer, i.e. prepreg. The insulating-material sheets put on top of the circuit-board blank are pressed, with the aid of heat and pressure, to form a unified insulator layer 1. In the insulating-material sheets, on the upper surface of one can also be a ready conductor-pattern layer, so that after pressing the circuit-board blank comprises at least two conductor-pattern layers, as shown by the series of figures. In this embodiment, conductor patterns 7 can, however, also be designed at the location of the components 9.

Both in the example shown in the figure series and in the above described modification, it is next possible to make vias 13, with the aid of which electrical contacts are made between the contact areas of the components 9 and the conductor patterns 6. For the making of vias, the contact openings 8 are cleaned of adhesive and other materials that may have been pushed into them. In connection with the cleaning of the contact openings 8, it is also possible to clean the contact areas of the components 9, thus further improving the preconditions for making a high-quality electrical contact. The cleaning can be performed using, for example, a plasma technique, chemically, or with the aid of a laser. If the contact openings 4 and the contact areas are already sufficiently clean, the cleaning can naturally be omitted.

If the contact openings 8 were made to only partly penetrate, the contact openings 8 are opened in this stage. It is also possible to proceed in such a way that the contact openings 8 are made entirely in this stage.

After cleaning, it is also possible to examine the success of the alignment of the component 9, as the contact areas of a correctly aligned component will be visible through the contact openings 8, when viewed from the direction of the conductor pattern.

After this, a conductor material is introduced to the contact openings 8, in such a way that it forms an electrical contact between the component 9 and the conductor pattern 6. The conductor material of the vias 13 can be made, for example, by filling the contact openings 8 with an electrically conductive paste. The conductor material can also be made using one of several growing methods known in the circuit-board industry. High-quality electrical contacts can be made, for example, by forming a metallurgical connection by growing a conductor material using a surfacing method, for example, a chemical or electrochemical method. One good alternative is the growing of a thin layer using a chemical method and continuing the growing using a more economical electrochemical method. The term filling refers to the fact that the contact openings are at least substantially filled with the conductor material. Instead of filling, surfacing can also be performed in such a way that only the edges of the contact openings are surfaced. In addition to these methods, it is of course possible to also use some other method, which will be beneficial in terms of the end result.

Figure 7:
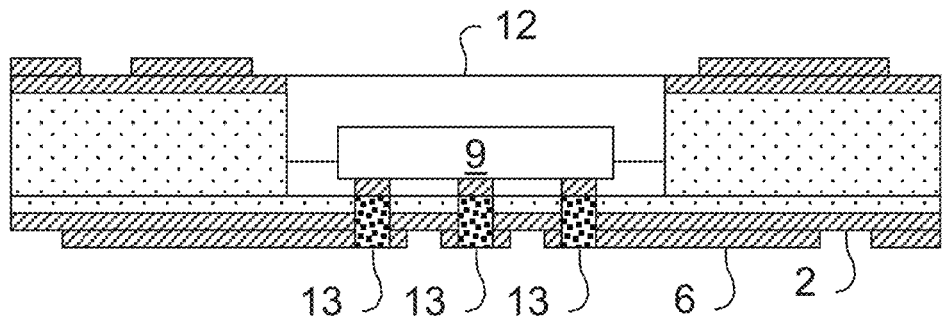
Figure 8:
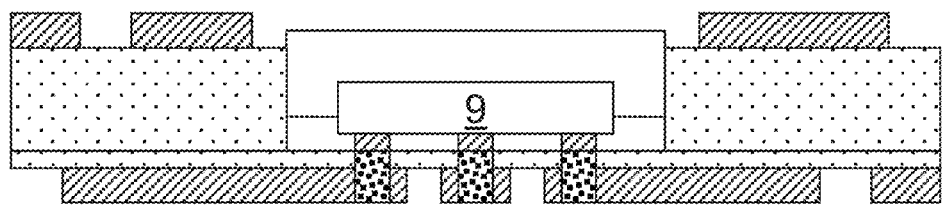

In the example of the figure series, the contact openings 8, the contact areas of the component 9, and the conductor patterns 6 are surfaced first of all with a thin conductor layer and then afterwards the thickness of the conductor layer is increased electrolytically until the contact openings 8 are filled with conductor material. FIG. 7 shows the structure after the growing. After this, the circuit-board blank is etched, to remove the excess conductor material. If a protective membrane is used on the surface of the conductor patterns 6 and 7, the conductor material is removed essentially only from those parts of the conductor foils 2 and 3 that remain outside the conductor patterns 6 and 7. Alternatively, it is possible to etch the entire conductor layer, so that the material of the conductor foils 2 and 3 is removed from outside the conductor patterns 6 and 7. In that case, material of the conductor patterns 6 and 7 too will be removed, but the conductor patterns 6 and 7 will be copied into the material of the conductor foils 2 and 3.

Figure 9:
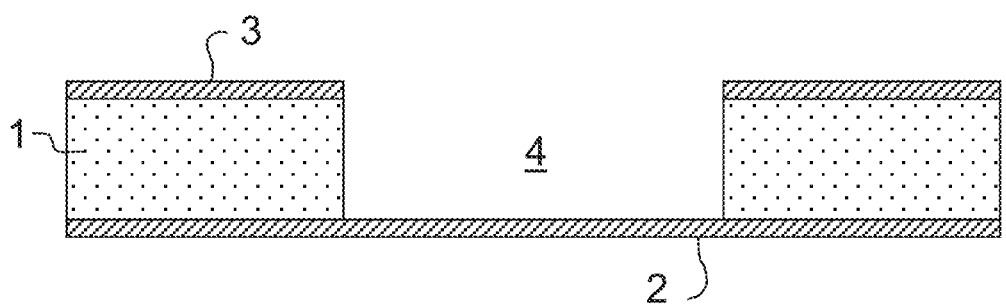
FIGS. 9-16 show a series of cross-sections of the intermediate stages of the circuit-board structures, in a manufacturing process according to a second embodiment.

The series of FIGS. 9-16 shows one variation of the examples described above. In the variation, the suitable parts of the method stages described above are utilized and the procedure is as follows:

A circuit-board blank is made, which comprises an insulator layer 1, a recess 4, and conductor foils 2 and 3 (FIG. 9).

Figure 10:
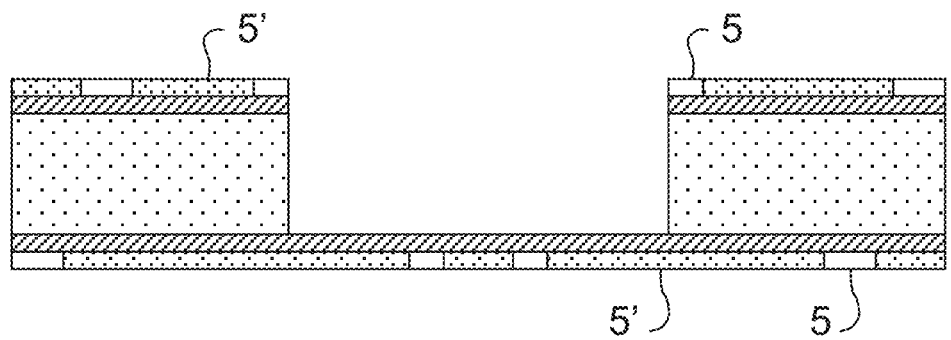

Photoresists 5 are spread and exposure takes place through the masks (FIG. 10). The exposed areas 5' are shown darkened in the figure.

Figure 11:
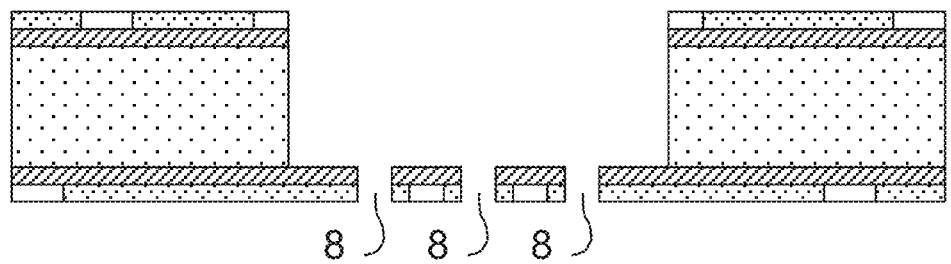

Contact openings 8 are made (FIG. 11).

Figure 12:
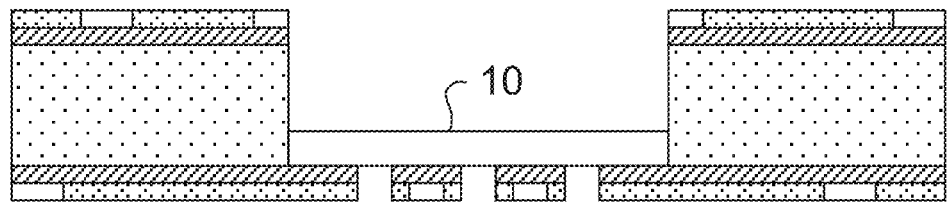
Figure 13:
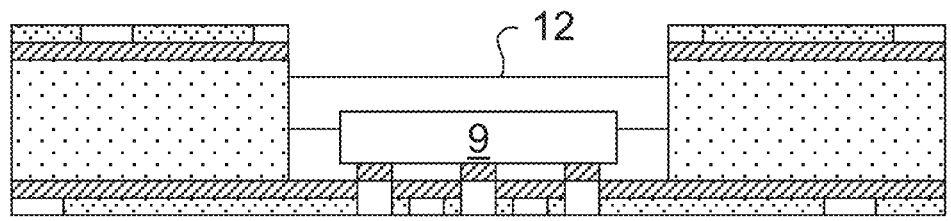

Adhesive 10 is spread (FIG. 12).

The component 9 is attached to the circuit-board blank with the aid of an adhesive layer 10 (FIG. 13) and the recess 4 is filled with a filler agent 12.

Figure 14:
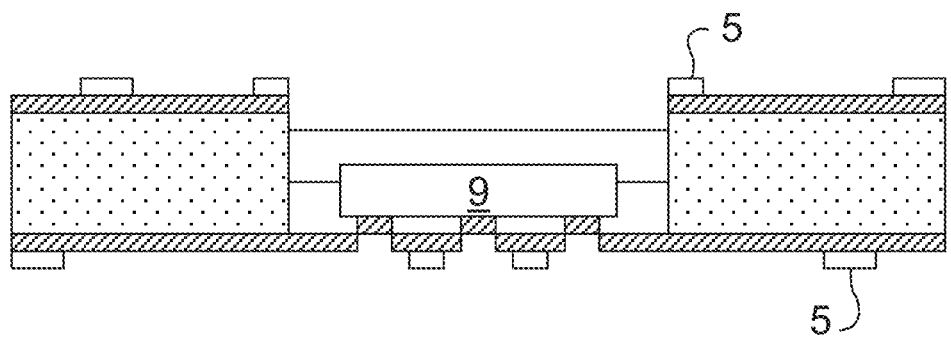

The resist is developed, so that all that remains are the unexposed areas of the resist 5. The contact openings 8 are cleaned. The circuit-board blank after these stages is shown in FIG. 14.

Figure 15:
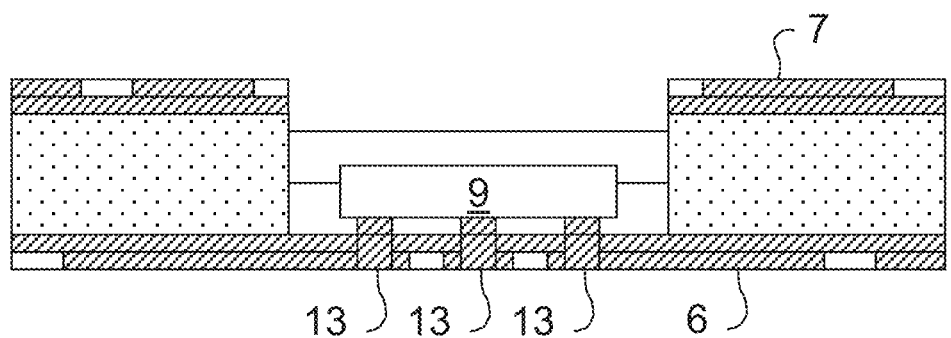

Conductor material is grown using an electrolytic method. The conductor material then grows in the openings of the resist 5 and the contact openings 8 are filled, thus forming both conductor patterns 6 and 7 and vias 13 (FIG. 15).

Figure 16:
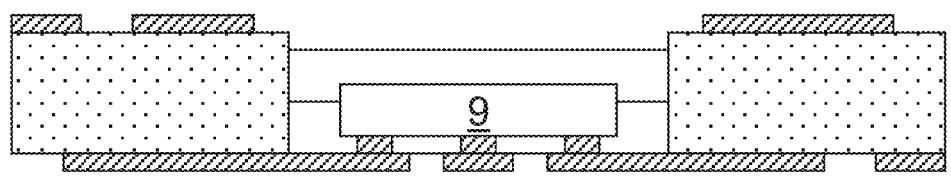

The resist 5 is removed and the conductor material is etched, so that the desired conductor pattern is separated from the conductor layer when the conductor material is removed from the areas between the conductor patterns (FIG. 16).

In the embodiment shown in the series of FIGS. 9-16 the conductor foils 2 and 3 are preferably thin relative to the conductor patterns 6 and 7 to be grown on their surfaces. The conductor foils 2 and 3 are thus intended to conduct the current required by the electrolytic growing to the growing areas. If the conductor foils 2 and 3 are thin relative to the conductor patterns 6 and 7, the etching of the conductor foils 2 and 3 away from outside the conductor patterns 6 and 7 will not substantially affect the relative dimensions of the conductor patterns 6 and 7.

Figure 17:
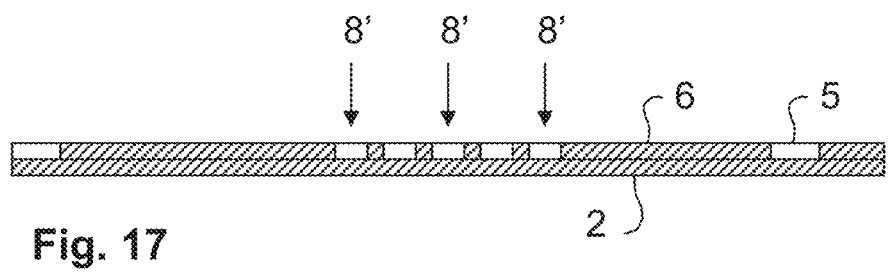
FIGS. 17-22 show a series of cross-sections of the intermediate stages of the circuit-board structures, in a manufacturing process according to a third embodiment.

The series of FIGS. 17-22 shows a third variation of the examples described above. In the variation, suitable parts of the method stages described above are utilized and the procedure is as follows:

A circuit-board blank is made, which comprises a conductor foil 2 and a conductor pattern 6 (FIG. 17). This can be made, for example, in such a way that a resist 5, which is exposed and developed, is spread on top of the conductor foil 2. After this, metal is grown in the openings formed in the resist 5, for example, using an electrochemical method. In this variation, contact openings are also defined in the exposure mask of the resist, so that the resist will remain at the locations of the contact openings 8'. Thus, in connection with the growing of the conductor pattern 6, contact openings 8 are also formed in the conductor patterns 6, and are thus aligned directly and in a self-aligning manner in the correct places relative to the conductor pattern 6.

Figure 18:
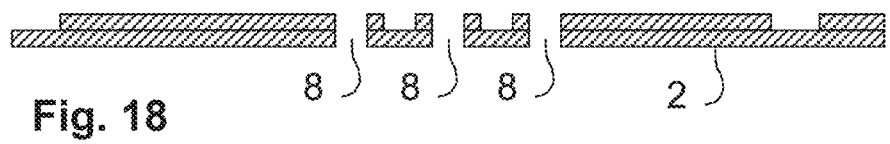

The resist is removed and the contact openings 8 are opened to also extend through the conductor foil 2 (FIG. 18).

Figure 19:
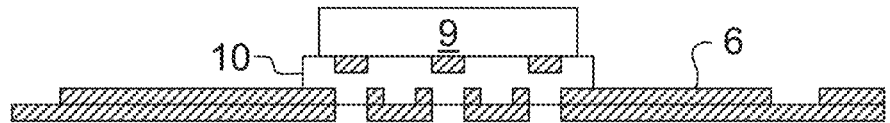

The component 9 is glued onto the surface of the conductor pattern 6 with the aid of an adhesive 10 (FIG. 19). The component is aligned in the correct position relative to the conductor pattern 6 and the contact openings 8.

Figure 20:
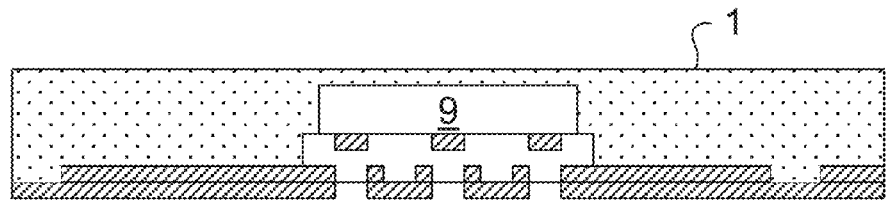

An insulating-material layer 1 is made on top of the circuit-board blank (FIG. 20).

Figure 21:
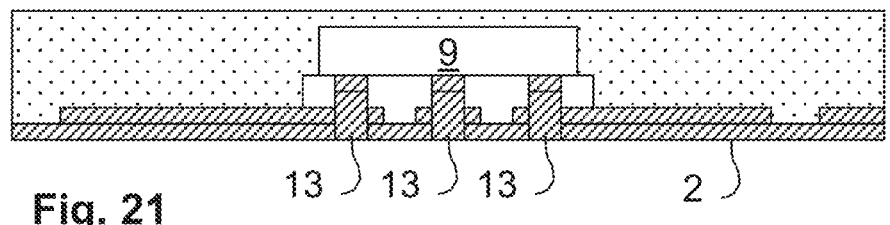

The contact openings 8 are cleaned and vias 13 are made in the contact openings from a conductor material (FIG. 21). In the example of the figure, the vias 13 are made using a surfacing method. In that case, the vias are surfaced in such a way that the necessary electrical contact arises, i.e. generally a conductor layer is made at least on the edges of the contact openings 8. In the example of the figure, the contact openings 8 are grown full of the conductor material. The more conductor material is put into a via 13, the better will be the conductivity of the via 13. The vias 13 are indeed preferably made to be at least substantially filled with conductor material.

Figure 22:
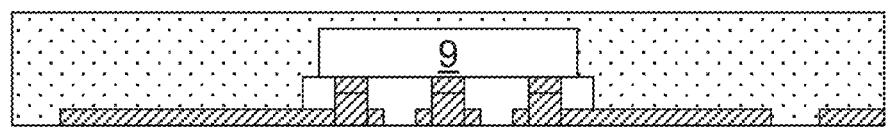

The conductor foil 2 is removed, for example, by etching (FIG. 22).

Figure 23:
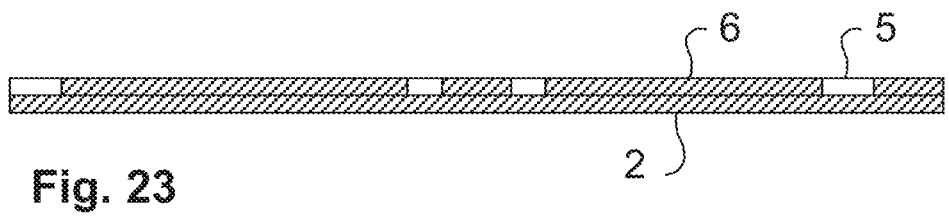
FIGS. 23-26 show a series of cross-sections of the intermediate stages of the circuit-board structures, in a manufacturing process according to a fourth embodiment.

The series of FIGS. 23-26 shown a fourth variation of the examples described above. In the variation, suitable parts of the method stages described above are utilized and the procedure is as follows:

A circuit-board blank is made, which comprises a conductor foil 2 and a conductor pattern 6 (FIG. 23). This can be made, for example, in such a way that a resist 5, which is exposed and developed, is spread on top of the conductor foil 2. After this, metal is grown in the openings formed in the resist 5, for example, using an electrochemical method.

Figure 24:
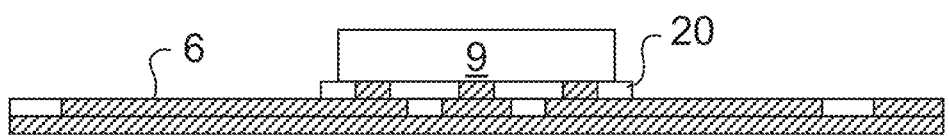

A component 9 is glued on top of the conductor pattern 6, with the aid of an anisotropically conductive adhesive 20 (FIG. 24). The anisotropically conductive adhesive

20 forms an electrical contact in the direction between the contact areas of the component and the conductor pattern 6. The adhesive 20 is, however, electrically insulating in the transverse direction, so that an electrical contact is not formed between the contact areas of the component, nor between the separate conductors of the conductor pattern 6.

Figure 25:
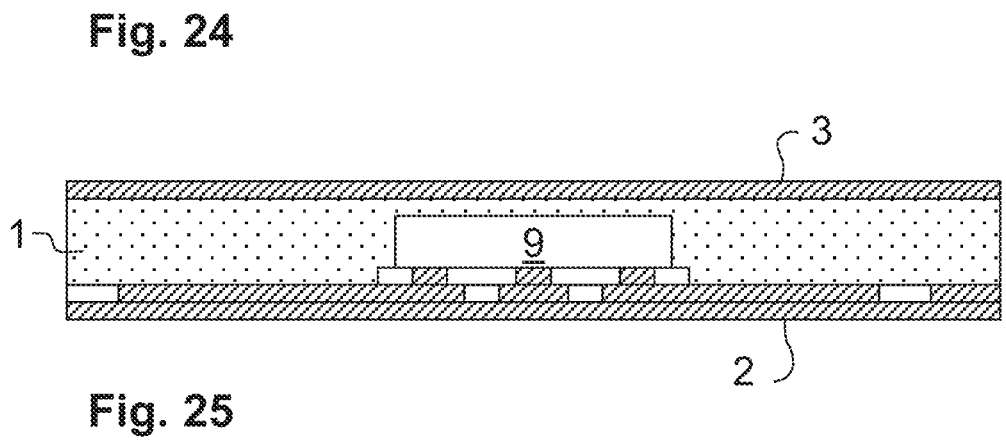

An insulating-material layer 1 is made on top of the circuit-board blank and on the surface of that a conductor foil 3 (FIG. 25).

Figure 26:
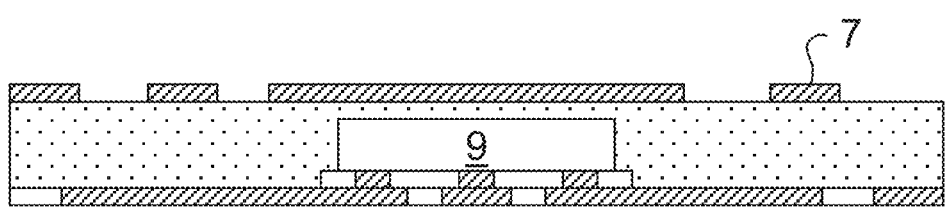

The conductor foil 2 is removed, for example, by etching. The conductor foil 3 is patterned to form a conductor pattern 7 (FIG. 26).

Figure 27:
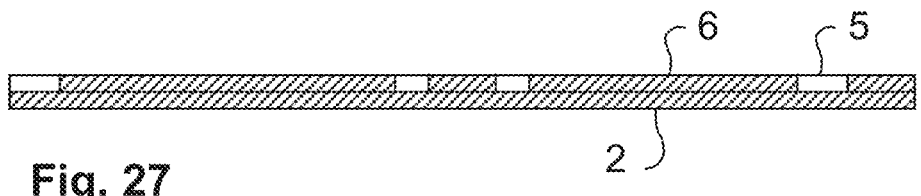
FIGS. 27-32 show a series of cross-sections of the intermediate stages of the circuit-board structures, in a manufacturing process according to a fifth embodiment.

The series of FIGS. 27-32 shows a fifth variation of the examples described above. In the method, suitable parts of the method stages described above are utilized, and the procedure is as follows:

A circuit-board blank is made, which comprises a conductor foil 2 and a conductor pattern 6 (FIG. 27). This can be made, for example, in such a way that a resist 5, which is exposed and developed, is spread onto top of the conductor foil 2. After this, metal is grown in the openings formed in the resist 5, for example, using an electrochemical method.

Figure 28:
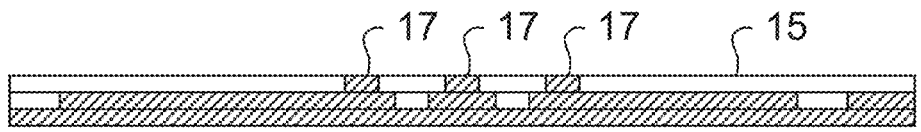

A second resist 15, which is exposed and developed, is spread on top of the resist 5 and conductor pattern 6. A conductor material is made in the opening formed in the resist 15, for example, using an electrochemical method. The made conductor areas form contact bumps 17 on the surface of the conductor pattern 6 (FIG. 28).

Figure 29:

The resists 5 and 15 are removed (FIG. 29).

Figure 30:
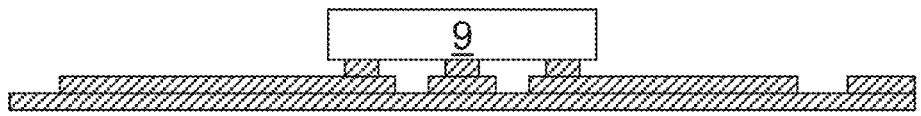

A component 9 is attached on top of the conductor pattern 6 and against the contact bumps 17, using a suitable method (FIG. 30). In the example of the figure, the joint is made by an ultrasonic bonding method or alternatively by a thermo-compression bonding method. In the example of the figure, a component 9 is used, which does not itself contain contact bumps.

Figure 31:
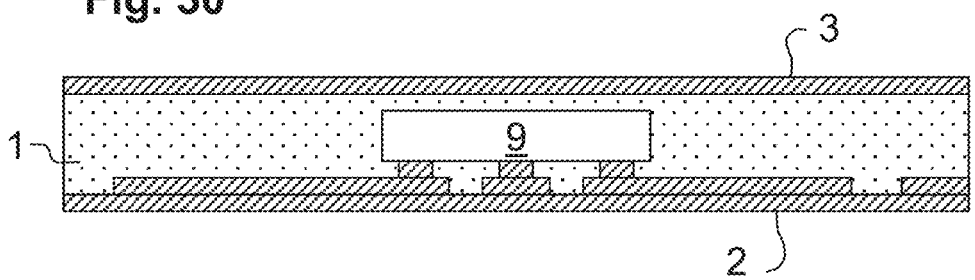

An insulating-material layer 1 is made on top of the circuit-board blank, and a conductor foil 3 of top of that (FIG. 31).

Figure 32:
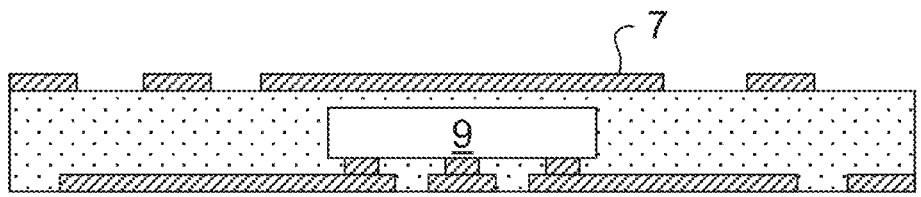

The conductor foil 2 is removed, for example, by etching. The conductor foil 3 is patterned to form a conductor pattern 7 (FIG. 32).

In the embodiments, it is possible to also use a separate support layer to support the conductor foil, or the conductor layer formed by the conductor foil and the conductor pattern.

A suitable intermediate layer, which will not dissolve in the etching agent used, or will dissolve in it extremely slowly, can also be used between the conductor foil and the conductor pattern, or on the surface of either of them. Thus the etching stops at the intermediate layer and the desired surface can be defined precisely. An intermediate layer of this kind can be made, for example, from some other metal, such as tin. If necessary, the intermediate layer can be removed, for example, chemically with some other etching agent.

When using a manufacturing method, in which the contact openings 8 are aligned and made after the manufacture of the conductor pattern 6, the sensitivity of the method to alignment errors can be reduced by dimensioning the diameter of the contact openings 8 to be greater than the width of the conductors of the conductor pattern 6.

There are numerous variations of the methods according to the examples presented above while the methods depicted by the examples can also be combined with each other. The variations can relate to individual process stages, or to the mutual sequence of the process stages.

Many features, which do not appear in the previous examples, can also be manufactured into the circuit-board structure. For example, in addition to vias that participate in the creation of electrical contacts, thermal vias can also be made, which are intended to conduct heat more efficiently away from the component 9. The increase in the efficiency of heat conducting is based on the thermal conductivity of the thermal via being greater than that of the insulating material surrounding the component. As electrical conductors are typically also good thermal conductors, the thermal vias can in most cases be made using the same technique and even in the same process stage as the electrical contacts to the components 9.

On the basis of the previous examples, it is obvious that the method can also be used for manufacturing many different kinds of three-dimensional circuit structures. The method can be used, for example, in such a way that several components, for example, semiconductor chips, are placed on top of each other, thus forming a packet containing several components, in which the components are connected to each other to form a single functional totality. Such a packet can be termed a three-dimensional multi-chip module.

The examples of the figures depict some possible processes, with the aid of which our invention can be exploited. However, our invention is not restricted to only the processes described above, but instead the invention covers various other processes too and their end products, within the full scope of the Claims and taking equivalence interpretation into account. The invention is also not restricted to only the structures and methods described by the examples, but instead it will be obvious to one versed in the art that various applications of our invention can be used to manufacture very many different kinds of electronic modules and circuit boards, which may even differ greatly from the examples presented. Thus the components and circuits of the figures are presented only with the intention of illustrating the manufacturing process. Many alterations can be made to the processes of the examples described above, while nevertheless not deviating from the basic idea according to the invention. The alterations can related, for example, to the manufacturing techniques depicted in the various stages, or to the mutual sequence of the process stages.

With the aid of the invention, it is also possible to manufacture component packets for attachment to a circuit board. Such packets can also contain several components, which are connected electrically to each other.

The method can also be used to manufacture entire electrical modules. The module can also be a circuit board, to the outer surface of which components can be attached, in the same way as to a conventional circuit board.

The invention claimed is:

1. A method for manufacturing a circuit-board structure, the method comprising:
   providing a conductor foil on an insulating material layer;
   spreading a resist layer on the conductor foil;
   forming a recess in the conductor foil and insulating material layer after spreading the resist layer;
   patterning the resist layer to form conductor-pattern masks having openings for conductor patterns;
   growing a conductor pattern on top of the conductor foil in the openings of the conductor-pattern masks;
   attaching a component to the conductor foil and conductor pattern; and removing conductor material of the conductor foil from outside the conductor pattern.

2. The method according to claim 1, wherein the resist layer is a photoresist layer.

3. The method according to claim 1, further comprising; adding a layer of a metal or metal alloy on a surface of the conductor pattern or on an interface between the conductor foil and the conductor pattern.

4. The method according to claim 1, further comprising; removing the resist layer after the growth of the conductor pattern.

5. The method according to claim 1, further comprising; forming contact openings in the conductor pattern.

6. The method according to claim 5, wherein the contact openings are formed through the conductor pattern and the conductor foil.

7. The method according to claim 1, further comprising; forming contact openings in the insulating material layer and the conductor foil.

8. The method according to claim 7, wherein the formation of the contact openings in the insulating material layer and the conductor foil does not form contact openings in the conductor pattern.

9. The method according to claim 8, further comprising; opening the contact openings in the conductor pattern corresponding to the formed contact openings in the insulating material layer and the conductor foil.

10. The method according to claim 1, wherein the component is attached within the recess.

11. The method according to claim 10, wherein the component is attached to the conductor foil and conductor pattern using an adhesive, said method further comprising the step of;
applying a sufficient amount of the adhesive to both attach the component to the circuit board structure and completely fill a space between the component and the structure coming against the component.

12. The method according to claim 1, further comprising; filling the recess with a filler material.

13. The method according to claim 1, wherein the insulator layer which surrounds the component is formed by adding a sheet of insulating material with a premade opening at the location of the component.

14. A method for manufacturing a circuit-board structure, the method comprising:
providing a conductor foil;
spreading a resist layer on the conductor foil;
patterning the resist layer to form conductor-pattern masks having openings for conductor patterns;
forming contact openings through the conductor pattern and the conductor foil;
growing a conductor pattern on top of the conductor foil in the openings of the conductor-pattern masks;
attaching a component to the conductor foil and conductor pattern;
removing conductor material of the conductor foil from outside the conductor pattern.

* * * * *